(12) United States Patent
Lee (10) Patent No.: US 8,861,205 B2
(45) Date of Patent: Oct. 14, 2014

(54) FOLDED STACKED PACKAGE AND METHOD OF MANUFACTURING THE SAME

(75) Inventor: Baik-Woo Lee, Gwangmyeong-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 319 days.

(21) Appl. No.: 13/198,370

(22) Filed: Aug. 4, 2011

(65) Prior Publication Data

US 2012/0170231 A1  Jul. 5, 2012

(30) Foreign Application Priority Data

Jan. 5, 2011  (KR) .................. 10-2011-0001103

(51) Int. Cl.
| | |
|---|---|
| *H05K 1/00* | (2006.01) |
| *H05K 1/14* | (2006.01) |
| *H05K 1/18* | (2006.01) |
| *H05K 1/02* | (2006.01) |

(52) U.S. Cl.
CPC ............... *H05K 1/145* (2013.01); *H05K 1/147* (2013.01); *H05K 1/185* (2013.01); *H05K 2201/097* (2013.01); *H05K 1/028* (2013.01); *H05K 2201/055* (2013.01); *H05K 1/189* (2013.01); *H05K 2201/056* (2013.01)
USPC .......................................... 361/749; 361/803

(58) Field of Classification Search
USPC ................................. 361/749, 818
See application file for complete search history.

(56) References Cited

U.S. PATENT DOCUMENTS

| | | | | |
|---|---|---|---|---|
| 6,160,967 | A | * | 12/2000 | Mizobuchi ............... 396/542 |
| 7,045,390 | B2 | | 5/2006 | Milla et al. |
| 7,358,444 | B2 | | 4/2008 | Nickerson et al. |
| 7,375,421 | B2 | | 5/2008 | Sakurai et al. |
| 2002/0114143 | A1 | | 8/2002 | Morrison et al. |
| 2005/0233496 | A1 | | 10/2005 | Haba et al. |
| 2006/0049495 | A1 | | 3/2006 | Hazeyama et al. |
| 2009/0090541 | A1 | | 4/2009 | Chia et al. |

FOREIGN PATENT DOCUMENTS

| | | | | |
|---|---|---|---|---|
| JP | 2010-016339 | * | 1/2010 | ............... H05K 1/02 |
| JP | 2010-16339 A | | 1/2010 | |

* cited by examiner

*Primary Examiner* — Andargie M Aychillhum
(74) *Attorney, Agent, or Firm* — Sughrue Mion, PLLC (57) ABSTRACT

A folded stacked package and a method of manufacturing the same are provided. The folded stacked package includes a flexible board or substrate comprising first, second and third device packaging units, and first and second folding unit units. The flexible board has wiring patterns formed thereon; one or more active devices disposed in at least one of the first, second, and third device packaging units; and one or more passive devices disposed on a surface of each of the first and second device packaging units. The passive devices include one or more first passive devices disposed on the surface of the first device packaging unit and one or more second passive devices disposed on the surface of the second device packaging unit. The first and second passive devices do not overlap each other when the flexible board is folded at the folding unit.

20 Claims, 9 Drawing Sheets

FOLDED STACKED PACKAGE AND METHOD OF MANUFACTURING THE SAME

CROSS-REFERENCE TO RELATED APPLICATION

This application claims priority from Korean Patent Application No. 10-2011-0001103, filed on Jan. 5, 2011 in the Korean Intellectual Property Office, the entire disclosure of which is incorporated herein by reference for all purposes.

BACKGROUND

1. Field

Methods and apparatuses consistent with exemplary embodiments generally relate to package technology, and particularly, to a stacked package technology for electronic components.

2. Description of the Related Art

As the performance of information technology (IT) devices is improved, mobile information technology (IT) devices such as mobile phones are becoming increasingly light-weight, thin and small. In accordance with this trend, an increasing number of electronic devices have been mounted on or embedded in boards. A technique of mounting electronic devices on boards is referred to as surface package technology (SMT), and a technique of embedding electronic devices in boards is referred to as embedded package technology.

The integration of various types of modules into a single electronic device, i.e., digital convergence, has become widespread and is expected to grow further. New digital convergence systems are expected to become more compact and perform more functions. For this, various electronic devices are required to be able to be mounted on system boards.

The types of electronic devices that can be mounted together on system boards are not limited to active devices, and include passive devices. Examples of active devices include integrated circuit (IC) chips such as a memory chip, a logic chip, an image sensor and the like. Examples of passive devices include capacitors, resistors such as a pull-up resistor, a pull-down resistor and the like, inductors, antennas, and micro-electro-mechanical systems (MEMS) devices.

Stacked packages are largely classified into a package-on-package, a package-in-package, and a folded stacked package. The package-on-package is a stacked package structure in which one or more upper packages are stacked on top of a lower package and the upper packages and the lower package are electrically connected by solder balls, and the package-in-package is a stacked package structure in which a package is deposited inside another package, and particularly, on the electronic devices on the other package and the two packages are electrically connected through wire bonding. The package-on-package and the package-in-package are desirable in that they can directly adopt existing single package structures. However, the package-on-package and the package-in-package are relatively complicated stacked structures and often have poor electrical connections between packages.

The folded stacked package is a structure in which packaged or unpackaged electronic devices are mounted on or attached onto a multiple-folded flexible board or substrate. The folded stacked package has a relatively simple structure because the flexible board or substrate is folded after disposing or mounting electronic devices thereon. In addition, since electronic devices or packages in the folded stacked package are electrically connected through the flexible board or substrate, the folded stacked package is highly reliable in terms of electrical connections between the electronic devices or the packages.

SUMMARY

According to an aspect of an exemplary embodiment, there is provided a folded stacked package including a flexible board or substrate configured to include a folding unit and first and second device packaging units connected by the folding unit and having wiring patterns formed thereon; one or more first devices configured to be embedded in at least one of the first and second device packaging units; and one or more second devices configured to be mounted on a surface of each of the first and second device packaging units, wherein the second devices mounted on the surface of the first device packaging unit and the second devices mounted on the surface of the second device packaging unit do not overlap each other when the flexible board or substrate is folded at the folding unit.

According to an aspect of another exemplary embodiment, there is provided a folded stacked package including a flexible board or substrate configured to include a first device packaging unit, a first folding unit, a second device packaging unit, a second folding unit, and a third device packaging unit and having wiring patterns formed thereon; one or more active devices configured to be embedded in at least one of the first, second, and third second device packaging units; and one or more passive devices configured to be mounted on a surface of each of the first and second device packaging units, wherein the passive devices include one or more first passive devices mounted on the surface of the first device packaging unit and one or more second passive devices mounted on the surface of the second device packaging unit and the first passive devices and the second passive devices do not overlap each other when the flexible board or substrate is folded at the folding unit.

According to an aspect of another exemplary embodiment, there is provided a method of manufacturing a folded stacked package, the method including preparing a first flexible layer, which is divided into a first device packaging unit, a first folding unit, a second device packaging unit, a second folding unit, and a third device packaging unit and have wiring patterns formed thereon that are aligned side-by-side horizontally; bonding at least one active device onto each of the first, second, and third device packaging units; forming a second flexible layer on the first flexible layer so as not to expose the active devices; forming via holes, through which connection pads of the active devices are exposed, by etching at least one of the first and second flexible layers; forming vias by depositing a conductive material, and forming wiring patterns on at least one of the first and second flexible layers such that the wiring patterns are connected to the vias; and mounting one or more first passive devices on the first device packaging unit and one or more second passive devices on the second device packaging unit so that the first passive devices and the second passive devices are electrically connected to the wiring patterns, wherein the first passive devices and the second devices are arranged so as not to overlap each other when the first and second flexible layers are folded at the first folding unit.

BRIEF DESCRIPTION OF THE DRAWINGS

Other features and aspects of the exemplary embodiments may be apparent from the following detailed description, with reference to the attached drawings in which.

DETAILED DESCRIPTION

The following description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. Also, descriptions of well-known functions and constructions may be omitted for increased clarity and conciseness.

Throughout the drawings and the detailed description, unless otherwise described, the same drawing reference numerals will be understood to refer to the same elements, features, and structures. The relative size and depiction of these elements may be exaggerated for clarity, illustration, and convenience.

Folded stacked packages according to exemplary embodiments can be suitable for use not only in IT devices (particularly, mobile IT devices such as a mobile phone) but also in bio-healthcare electronic devices and wearable electronic devices as a system integration package technology. For example, the folded stacked packages according to exemplary embodiments can be applied to mobile devices (such as mobile phones, including smart phones, personal digital assistants (PDAs), or portable multimedia players (PMPs)), portable computers (such as laptop computers or tablet computers), portable electronic devices (such as digital cameras or digital camcorders), connected health monitoring devices (such as heart disease bandage sensors) which can monitor the health conditions of an individual by being bonded onto the body of the individual, and implant devices which can be implanted into a limited space such as the body of an individual. The folded stacked packages according to exemplary embodiments can also be applied to portable electronic devices into which a variety of functions are integrated and non-portable electronic devices which need to be compact in size.

Figure 1A:
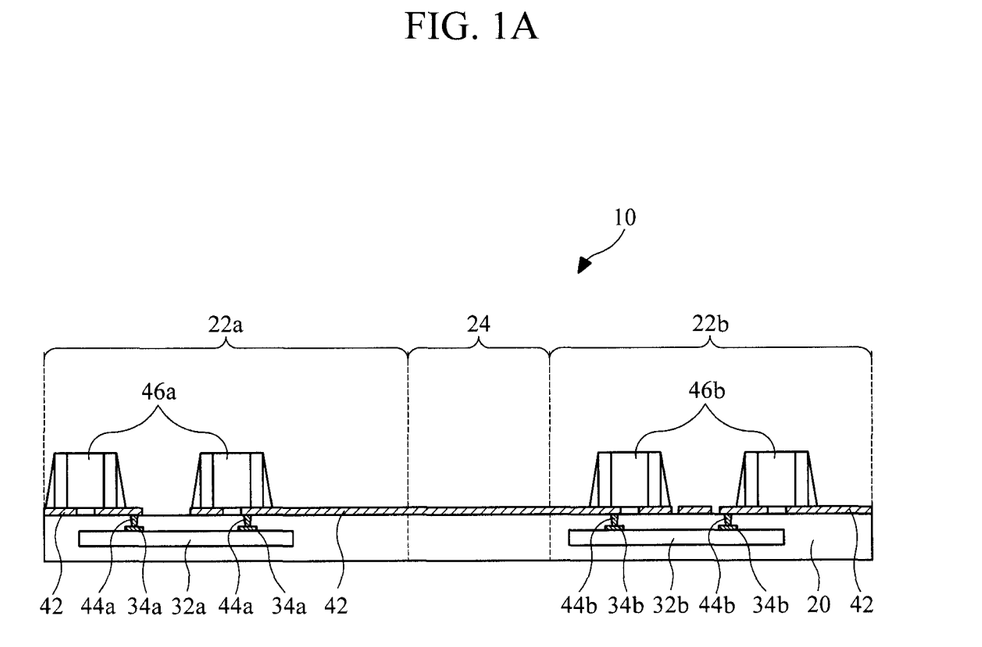
FIG. 1A is a cross-sectional view illustrating an example of a folded stacked package in an unfolded state.
Figure 1B:
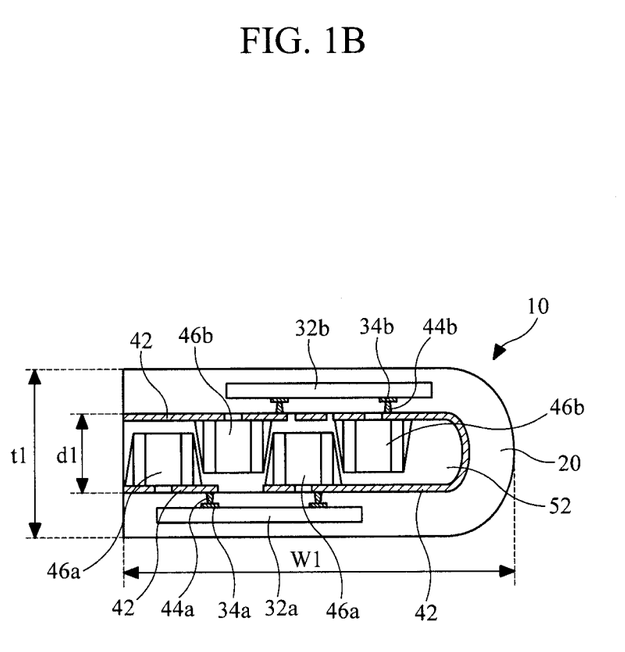
FIG. 1B is a cross-sectional view illustrating an example of a folded stacked package in a folded state.

FIGS. 1A and 1B illustrate examples of a folded stacked package. More specifically, FIG. 1A illustrates an example of a folded stacked package in an unfolded state, and FIG. 1B illustrates an example of a folded stacked package in a folded state. Referring to FIGS. 1A and 1B, folded stacked package 10 includes a flexible board or substrate 20, first and second active devices 32a and 32b, first passive devices 46a and second passive devices 46b. The first and second active devices 32a and 32b may be collectively referred to as the active devices 32, and the first passive devices 46a and the second passive devices 46b may be collectively referred to as the passive devices 46. The sizes and thicknesses of the elements of the folded stacked package 10 may not be to scale and may be exaggerated for clarity and convenience, and the number and locations of wiring patterns 42, first vias 44a and second vias 44b in the flexible board or substrate 20 are merely exemplary, and are not limited to those illustrated in FIGS. 1A and 1B. The first vias 44a and the second vias 44b may be collectively referred to as the vias 44.

As an example, the active devices 32 may be embedded in the flexible board or substrate 20, and the passive devices 46 may be mounted on the flexible board or substrate 20. As another example, the passive devices 46 may be embedded in the flexible board or substrate 20, and the active devices 32 may be mounted on the flexible board or substrate 20. As another example, some of the active devices 32 and some of the passive devices 46 may be embedded in the flexible board or substrate 20, and other active devices 32 and other passive devices 46 may be mounted on the flexible board or substrate 20.

The flexible board or substrate 20 includes first and second device packaging units 22a and 22b. The first and second device packaging units 22a and 22b may be collectively referred to as the device packaging units 22. For example, the flexible board or substrate 20 may be divided into the first device packaging unit 22a, a folding unit 24, and the second device packaging unit 22b, and the first device packaging unit 22a, the folding unit 24, and the second device packaging unit 22b may be aligned side-by-side horizontally. The device packaging units 22 correspond to parts of the flexible board or substrate 20 on which the active devices 32 and/or the passive devices 46 are disposed. A folding unit 24 corresponds to a part of the flexible board or substrate 20 which can be folded so that the device packaging units 22 can face each other vertically. For example, the flexible board or substrate 20 may be formed of a flexible material such as a polymer (e.g., polyimide). As another example, at least the folding unit 24 may be formed of a flexible material, and the device packaging units 22 may be formed of a rigid material.

The active devices 32 are embedded in the device packaging units 22. That is, the active devices 32 may be embedded in the flexible board or substrate 20 instead of being mounted on the flexible board or substrate 20. Referring to FIGS. 1A and 1B, one active device 32 is embedded in each of the device packaging units 22, but such arrangement is not restricted to this. For example, one of the device packaging units 22 may not have an active device 32 embedded therein. As another example, one of the device packaging units 22 may have more than one active device 32 embedded therein, in which case the more than one active device 32 may be aligned side-by-side or stacked one on top of another.

The active devices 32, which are embedded in the device packaging units 22, may be of the same type or of different types. There is no limit to the types of active devices 32 that can be embedded in the device packaging units 22. Examples of the active devices 32 include nearly all types of active devices, such as memory chips, logic chips or the like. For example, the active devices 32 may all be memory chips that can configure a memory module. As another example, some of the active devices 32 may be memory chips, and other active devices 32 may be logic chips.

First connection pads 34a and second connection pads 34b may be formed on the active devices 32 for electrical connections to external devices. The first connection pads 34a and the second connection pads 34b may be collectively referred to as the connection pads 34. As described above, since the active devices 32 are embedded in the flexible board or substrate 20, the active devices 32 can be electrically connected to external devices via the vias 44 without the aid of, for example, solder joints, such as solder balls. Accordingly, a thickness t1 of the folded stacked package 10 may be reduced by an amount corresponding to the height of solder joints.

One or more passive devices 46 may be mounted on each of the device packaging units 22. That is, the passive devices 46 may be mounted on the flexible board or substrate 20 of the folded stacked package 10, and may face the same direction, e.g., a direction from the bottom to the top of the flexible board or substrate 20, as illustrated in FIG. 1A. Referring to FIGS. 1A and 1B, two passive devices 46 are mounted on each of the device packaging units 22, but the exemplary embodiments are not restricted to this. That is, only one or three or more passive devices may be mounted on each of the device packaging units 22. The number of passive devices 46 mounted on one of the device packaging units 22 may be different from the number of passive devices 46 mounted on the other device packaging units 22. For example, the number of passive devices 46 mounted on the first device packaging unit 22a may be greater than the number of passive devices 46 mounted on the second device packaging unit 22b.

The passive devices 46 may be arranged on the device packaging units 22 such that the thickness t1 of the folded stacked package 10 can be minimized. As an example, the passive devices 46 may be arranged on the flexible board or substrate 20 such that the first passive devices 46a and the second passive devices 46b can be prevented from overlapping each other when the flexible board or substrate 20 is folded at the folding unit 24, as illustrated in FIG. 1B. There is no limit to the manner in which the first passive devices 46a and the second passive devices 46b are arranged on the flexible board or substrate 20 so as not to overlap each other in a case in which the flexible board or substrate 20 is folded. For example, the passive devices 46 may be arranged on the flexible board or substrate 20 such that the first passive devices 46a and the second passive devices 46b can be alternately arranged in a case in which the flexible board or substrate 20 is folded.

As another example, the passive devices 46 may be arranged on the flexible board or substrate 20 such that the second passive devices 46b can be disposed in the empty spaces between the first passive devices 46a and/or on parts of the flexible board or substrate 20 where the first passive devices 46a are not mounted, and that the first passive devices 46a can be disposed in the empty spaces between the second passive devices 46b and/or on parts of the flexible board or substrate 20 where the second passive devices 46b are not mounted. For example, the first passive devices 46a may be disposed on the flexible board or substrate 20 at regular intervals, and the second passive devices 46b may be disposed on the flexible board or substrate 20 at regular intervals. In this example, since the first passive devices 46a and the second passive devices 46b do not overlap each other when the flexible board or substrate 20 is folded, a distance d1 between the first and second device packaging units 22a and 22b may be minimized, and thus, the thickness t1 of the folded stacked package 10 in the folded state may be reduced.

Figure 2A:
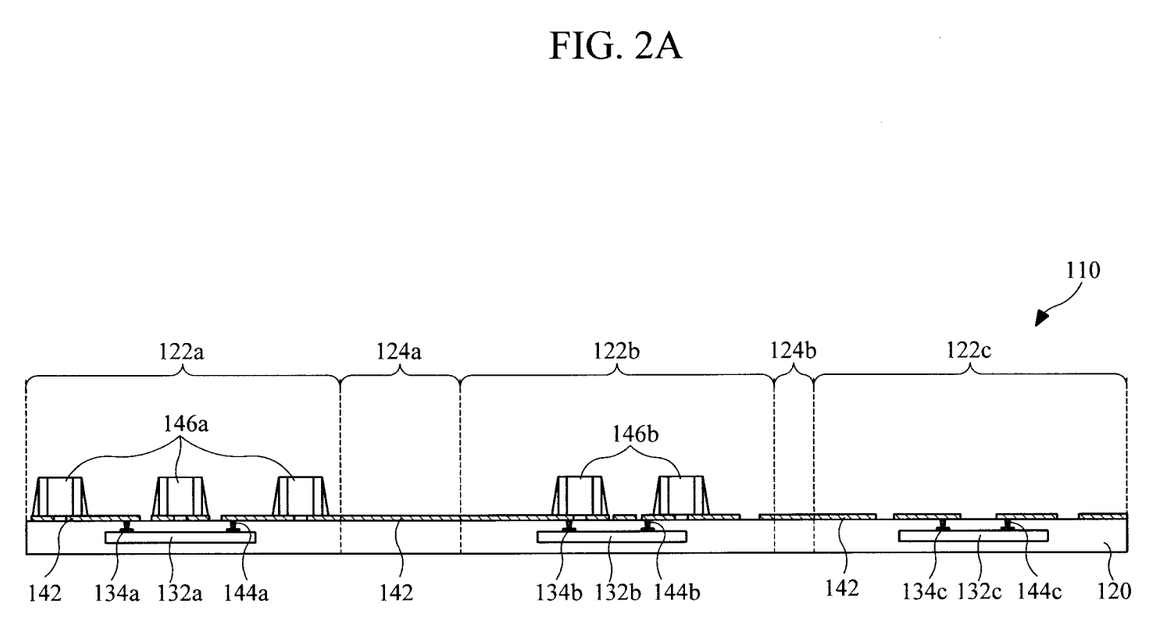
FIG. 2A is a cross-sectional view illustrating another example of a folded stacked package in an unfolded state.

The passive devices 46 may be densely distributed over each of the device packaging units 22. For example, when the number of first passive devices 46a is greater than the number of second passive devices 46b, two of the first passive devices 46a may be disposed on either end of the first device packaging unit 22a, as illustrated in FIG. 2A, so that the second passive devices 46b can be disposed between the two first passive devices 46a on either end of the first device packaging unit 22a when the flexible board or substrate 20 is folded. When the number of first passive devices 46a is only one greater than the number of second passive devices 46b, the second passive devices 46b may be disposed only between the first passive devices 46a when the flexible board or substrate 20 is folded. In this case, since the passive devices 46 are densely distributed over each of the device packaging units 22, it is possible to increase the packaging density of the folded stacked package 10 and minimize a width w1 of the folded stacked package 10.

The wiring patterns 42 are formed on the surface of the flexible board or substrate 20. For example, the wiring patterns 42 may be formed of copper foil having a predetermined thickness by using a patterning technique involving an etching process (e.g., photolithography) well known to one of ordinary skill in the art to which the aspects of the exemplary embodiments pertain. The wiring patterns 42 may not necessarily need to be formed of copper, and may be formed of another conductive material having excellent electrical properties.

The wiring patterns 42 are merely exemplary. In a case in which the active devices 32 and the passive devices 46 are all electrically connected, the wiring patterns 42 may be formed in different shapes or at different positions as compared to FIG. 1A. For example, the shape of the wiring patterns 42 may vary according to the electrical properties of the folded stacked package 10 and how the active devices 32 and the passive devices 46 are electrically connected. The wiring patterns 42 may be formed not only on the device packaging units 22 but also on the folding unit 24. The wiring patterns 42 are illustrated in FIG. 1A as being formed only on the top surface of the flexible board or substrate 20, but the exemplary embodiments are not limited thereto and the wiring patterns 42 may also be formed at the bottom of the flexible board or substrate 20. Some of the wiring patterns 42 are electrically connected to external connection ports (not shown) for electrically connecting the folded stacked package 10 to an external device.

The active devices 32, which are embedded in the flexible board or substrate 20, may be electrically connected to the wiring patterns 42 via the vias 44. The vias 44 are formed of a conductive material such as copper. The vias 44 may be formed of the same material as or a different material from that of the wiring patterns 42. The vias 44 electrically connect the connection pads 34 of the active devices 32 and the wiring patterns 42 and may be formed to extend outwardly from the inside of the flexible board or substrate 20.

The vias 44 electrically connect the inside of the flexible board or substrate 20 and the devices formed on the flexible board or substrate 20. The vias 44 may be formed by forming via holes in the flexible board or substrate 20 and filling the via holes with a conductive material. The wiring patterns 42 or the passive devices 46 may be disposed on the vias 44. For example, the passive devices 46 may be disposed directly over the active devices 32, which are embedded in the flexible board or substrate 20. In this example, the length of the electrical connections between the active devices 32 and the passive devices 46 may be minimized, and there is no need to penetrate the flexible board or substrate 20. Therefore, it is possible to minimize parasitic resistance or parasitic inductance and thus to improve the electrical properties of the folded stacked package 10.

The vias 44 are different from plated through holes (PTHs), which electrically connect devices formed on opposite sides of a substrate. PTHs are formed through a package board as electrical connections. PTHs occupy a relatively large area, and may thus decrease the packaging density of a packaging board. In a folded stacked package having PTHs, long loops are generally formed between devices. Thus, the electrical properties of a folded stacked package having PTHs may deteriorate due to parasitic resistance and parasitic inductance.

Since the vias 44 occupy a smaller area than PTHs and the active devices 32 and the passive devices 46 can be disposed above or below the vias 44, the use of the vias 44 may increase the packaging density of the folded stacked package 10. Since the passive devices 46 can be disposed directly above the active devices 32, the electrical connections between the active devices 32 and the passive devices 46 may be reduced, and thus, the electrical properties of the folded stacked package 10 may be improved.

Referring to FIG. 1B, once the flexible board or substrate 20 is folded at the folding unit 24, the first and second device packaging units 22a and 22b may be bonded together by a bonding unit 52. The bonding unit 52 may be formed of a dielectric material. As an example, the bonding unit 52 may be formed of a cured adhesive paste to provide improved adhesion between the passive devices 46. As another example, the bonding unit 52 may be formed of a dielectric material. There is nearly no limit to the type of material that can be used to form the bonding unit 52. For example, the bonding unit 52 may be formed of a prepreg prepared by impregnating a base substrate formed of paper with an uncured material such as an epoxy resin, a polyimide resin, a bismaleimides resin, or a phenol resin and curing the base substrate.

Figure 2B:
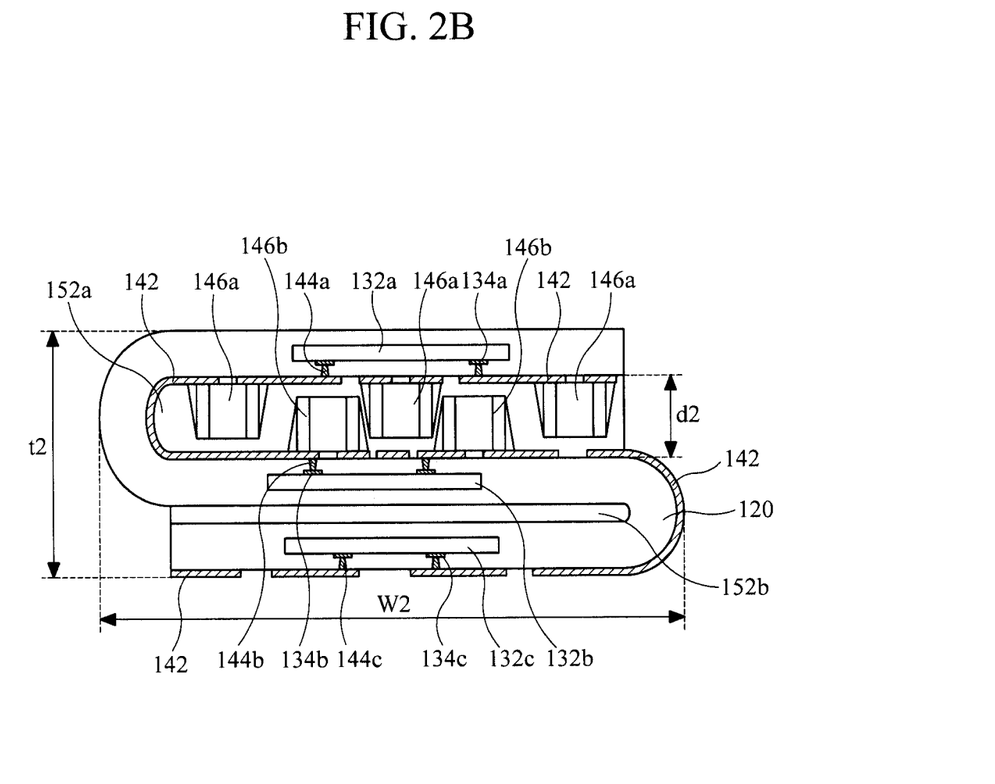
FIG. 2B is a cross-sectional view illustrating another example of a folded stacked package in a folded state.

FIGS. 2A and 2B illustrate examples of a folded stacked package. More specifically, FIG. 2A illustrates another example of a folded stacked package in an unfolded state, and FIG. 2B illustrate another example of a folded stacked package in a folded state. Referring to FIGS. 2A and 2B, folded stacked package 110 includes a flexible board or substrate 120, first, second, and third active devices 132a, 132b, and 132c, and first passive devices 146a and second passive devices 146b. The first, second, and third active devices 132a, 132b, and 132c may be collectively referred to as the active devices 132, and the first passive devices 146a and the second passive devices 146b may be collectively referred to as the passive devices 146. The sizes and thicknesses of the elements of the folded stacked package 10 may be exaggerated for clarity and convenience, and the number and locations of wiring patterns 142, first vias 144a, second vias 144b, and third vias 144c in the flexible board or substrate 120 are merely exemplary, and are not limited to those illustrated in FIGS. 2A and 2B. The first vias 144a, the second vias 144b, and the third vias 144c may be collectively referred to as the vias 144. The folded stacked package 110 will hereinafter be described in detail, focusing mainly on differences with the folded stacked package 10 illustrated in FIGS. 1A and 1B.

As an example, the active devices 132 may be embedded in the flexible board or substrate 120, and the passive devices 146 may be mounted on the flexible board or substrate 120. As another example, the passive devices 146 may be embedded in the flexible board or substrate 120, and the active devices 132 may be mounted on the flexible board or substrate 120. As another example, some of the active devices 132 and some of the passive devices 146 may be embedded in the flexible board or substrate 120, and other active devices 132 and other passive devices 146 may be mounted on the flexible board or substrate 120.

The flexible board or substrate 120 may include the first, second, and third device packaging units 122a, 122b, and 122c, which are connected to one another by first and second folding units 124a and 124b. The first and second folding units 124a and 124b may be collectively referred to as the folding units 124. For example, the flexible board or substrate 120 may be divided into the first device packaging unit 122a, the first folding unit 124a, the second device packaging unit 122b, the second folding unit 124b, and the third device packaging unit 122c, and the first device packaging unit 122a, the first folding unit 124a, the second device packaging unit 122b, the second folding unit 124b, and the third device packaging unit 122c may be aligned side-by-side horizontally. The device packaging units 122 correspond to parts of the flexible board or substrate 120 on which the active devices 132 and/or the passive devices 146 are disposed. The folding units 124 correspond to parts of the flexible board or substrate 120 which can be actually folded such that the device packaging units 122 can be disposed vertically with respect to one another.

The active devices 132 are embedded in the device packaging units 122. That is, the active devices 132 may be embedded in the flexible board or substrate 120 instead of being mounted on the flexible board or substrate 120. Referring to FIGS. 2A and 2B, one active device 132 is embedded in each of the device packaging units 122, but the exemplary embodiments are not restricted to this. First connection pads 134a, second connection pads 134b, and third connection pads 134c may be disposed on the active devices 132 for electrical connections to external devices. The first connection pads 134a, the second connection pads 134b, and the third connection pads 134c may be collectively referred to as the connection pads 134. Due to the connection pads 134, the folded stacked package 110, like the folded stacked package 10 illustrated in FIGS. 1A and 1B, the connection pads 134, do not need solder joints, such as solder balls.

One or more passive devices 146 may be mounted on each of the device packaging units 122. As an example, the passive devices 146 may be mounted on the first and second device packaging units 122a and 122b, but not on the third device packaging unit 122c. In this example, since no passive devices are disposed in the space between the second and third device packaging units 122b and 122c when the flexible board or substrate 120 is folded, as illustrated in FIG. 2B, a thickness t2 of the folded stacked package 110 may be reduced. As another example, the passive devices 146 may also be mounted on the third device packaging unit 122c, according to another aspect of the exemplary embodiments.

The passive devices 146 may be mounted on the flexible board or substrate 120, and may face the same direction, e.g., a direction from the bottom to the top of the flexible board or substrate 120, as illustrated in FIG. 2A. Referring to FIGS. 2A and 2B, three passive devices 146 and two passive devices 146 are mounted on the first and second device packaging units 122a and 122b, respectively, but the exemplary embodiments are not restricted to this. As an example, the number of passive devices 146 mounted on the first device packaging unit 122a may be the same as the number of passive devices 146 mounted on the second device packaging unit 122b. As another example, the number of passive devices 146 mounted on the first device packaging unit 122a may be different from, for example, less than, the number of passive devices 146 mounted on the second device packaging unit 122b.

The passive devices 146 may be arranged on the device packaging units 122 such that the thickness t2 of the folded stacked package 110 can be minimized, as illustrated in FIG. 2B.

As an example, the passive devices 146 may be arranged on the flexible board or substrate 120 such that the first passive devices 146a and the second passive devices 146b can be prevented from overlapping each other when the flexible board or substrate 120 is folded at the first folding unit 124a, as illustrated in FIG. 2B. There is no limit to the manner in which the first passive devices 146a and the second passive devices 146b are arranged on the flexible board or substrate 120 so as not to overlap each other in a case in which the flexible board or substrate 120 is folded.

As another example, the passive devices 146 may be arranged on the flexible board or substrate 120 such that the second passive devices 146b can be disposed in the empty spaces between the first passive devices 146a and/or on parts of the flexible board or substrate 120 where the first passive devices 146a are not mounted, and that the first passive devices 146a can be disposed in the empty spaces between the second passive devices 146b and/or on parts of the flexible board or substrate 120 where the second passive devices 146b are not mounted. In this example, since the first passive devices 146a and the second passive devices 146b do not overlap each other when the flexible board or substrate 120 is folded, a distance d2 between the first and second device packaging units 122a and 122b may be minimized, and thus, the thickness t2 of the folded stacked package 110 in the folded state may be reduced.

The passive devices 146 may be densely distributed over each of the first and second device packaging units 122a and 122b. For example, when the number of first passive devices 146a is greater than the number of second passive devices 146b, two of the first passive devices 146a may be disposed on either end of the first device packaging unit 122a so that the second passive devices 146b can be disposed between the two first passive devices 146a on either end of the first device packaging unit 122a when the flexible board or substrate 120 is folded. When the number of first passive devices 146a is only one greater than the number of second passive devices 146b, the second passive devices 146b may be disposed only between the first passive devices 146a when the flexible board or substrate 120 is folded.

The wiring patterns 142 are formed on the surface of the flexible board or substrate 120. The wiring patterns 142 are merely exemplary. For example, the shape of the wiring patterns 142 may vary according to the electrical properties of the folded stacked package 110 and how the active devices 132 and the passive devices 146 are electrically connected. The wiring patterns 142 may be formed not only on the first and second device packaging units 122a and 122b but also on the folding units 124 and the third device packaging unit 122c.

The active devices 132, which are embedded in the flexible board or substrate 120, may be electrically connected to the wiring patterns 142 via the vias 144. The vias 144 are formed of a conductive material such as copper. The vias 144 may be formed of the same material as or a different material from that of the wiring patterns 142. The vias 144 electrically connect the connection pads 134 of the active devices 132 and the wiring patterns 142 and may be formed to extend outwardly from the inside of the flexible board or substrate 20.

The vias 144, as compared to PTHs, may increase the packaging density of the folded stacked package 110 and may improve the electrical properties of the folded stacked package 110 by reducing the electrical connections between the active devices 132 and the passive devices 146.

Referring to FIG. 2B, once the flexible board or substrate 120 is folded twice at the first and second folding units 124a and 124b, the first and second device packaging units 122a and 122b may be bonded together by a first bonding unit 152a, and the second and third device packaging units 122b and 122c may be bonded together by a second bonding unit 152b. As an example, the first bonding unit 152a may be formed of a cured adhesive paste to provide improved adhesion between the passive devices 146, and the second bonding unit 152b may be formed of a bonding sheet. As another example, the first and second bonding units 152a and 152b may both be formed of a dielectric material.

The folded stacked packages 10 and 110 are merely exemplary. For example, referring to FIG. 2B, a plurality of passive devices may also be disposed in the space between the second and third device packaging units 122b and 122c, i.e., in a part of the folded stacked package 110 where the second bonding unit 152b is disposed, without overlapping one another. In this example, the width of the second folding unit 124b may be increased. Thus, the distance between the second and third device packaging units 122b and 122c may be increased, and the width w2 of the folded stacked package 110 may be further reduced. As another example, the folded stacked package 110 may also include a third folding unit (not shown) and a fourth device packaging unit (not shown), and one or more passive devices may be disposed not only on the first, second, and third device packaging units 122a, 122b, and 122c but also on the fourth device packaging unit.

An example of a method of manufacturing a folded stacked package, and more particularly, the folded stacked package 110 illustrated in FIGS. 2A and 2B, will hereinafter be described in detail with reference to FIGS. 3A through 3E. Further, the following example of a method of manufacturing a folded stacked package can be equally applied to the folded stacked package 10 illustrated in FIGS. 1A and 1B.

FIGS. 3A through 3E illustrate an example of a method of manufacturing a folded stacked package, and more particularly, the folded stacked package 110 illustrated in FIGS. 2A and 2B. By folding the flexible board or substrate 120 of the folded stacked package 110 twice at the first and second folding units 124a and 124b, the folded stacked package 110 illustrated in FIG. 2B may be obtained.

Figure 3A:
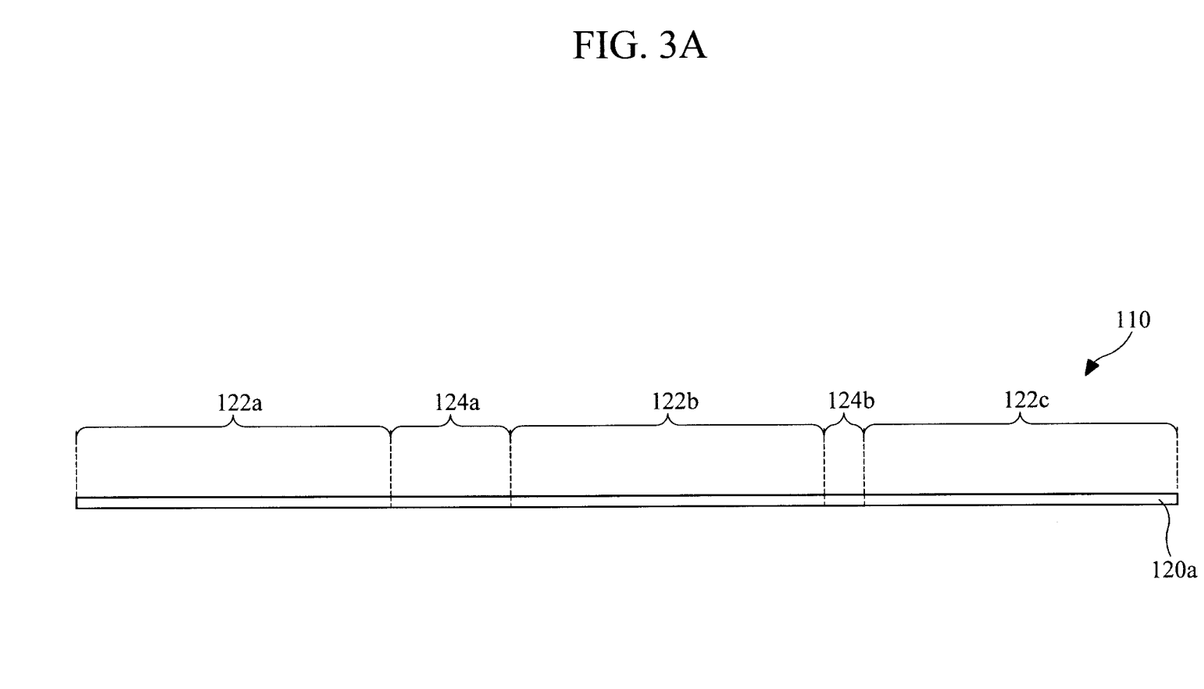
FIGS. 3A through 3E are cross-sectional views illustrating an example of a method of manufacturing the folded stacked package illustrated in FIG. 2.

Referring to FIG. 3A, a first flexible layer 120a is prepared. As an example, the first flexible layer 120a may be formed of a cured or half-cured polymer, e.g., polyimide. In this example, the first flexible layer 120a may be bonded later in subsequent processes to a second flexible layer 120b through thermal lamination, thereby completing the formation of the flexible board or substrate 120. As another example, the first flexible layer 120a may be formed of a rigid material on a carrier, in which case, the carrier may be detached later in subsequent processes from the flexible board or substrate 120. The first flexible layer 120a may be divided into the first device packaging unit 122a, the first folding unit 124a, the second device packaging unit 122b, the second folding unit 124b, and the third device packaging unit 122c. According to an exemplary embodiment no physical boundaries between the first device packaging unit 122a, the first folding unit 124a, the second device packaging unit 122b, the second folding unit 124b, and the third device packaging unit 122c are necessary.

Figure 3B:
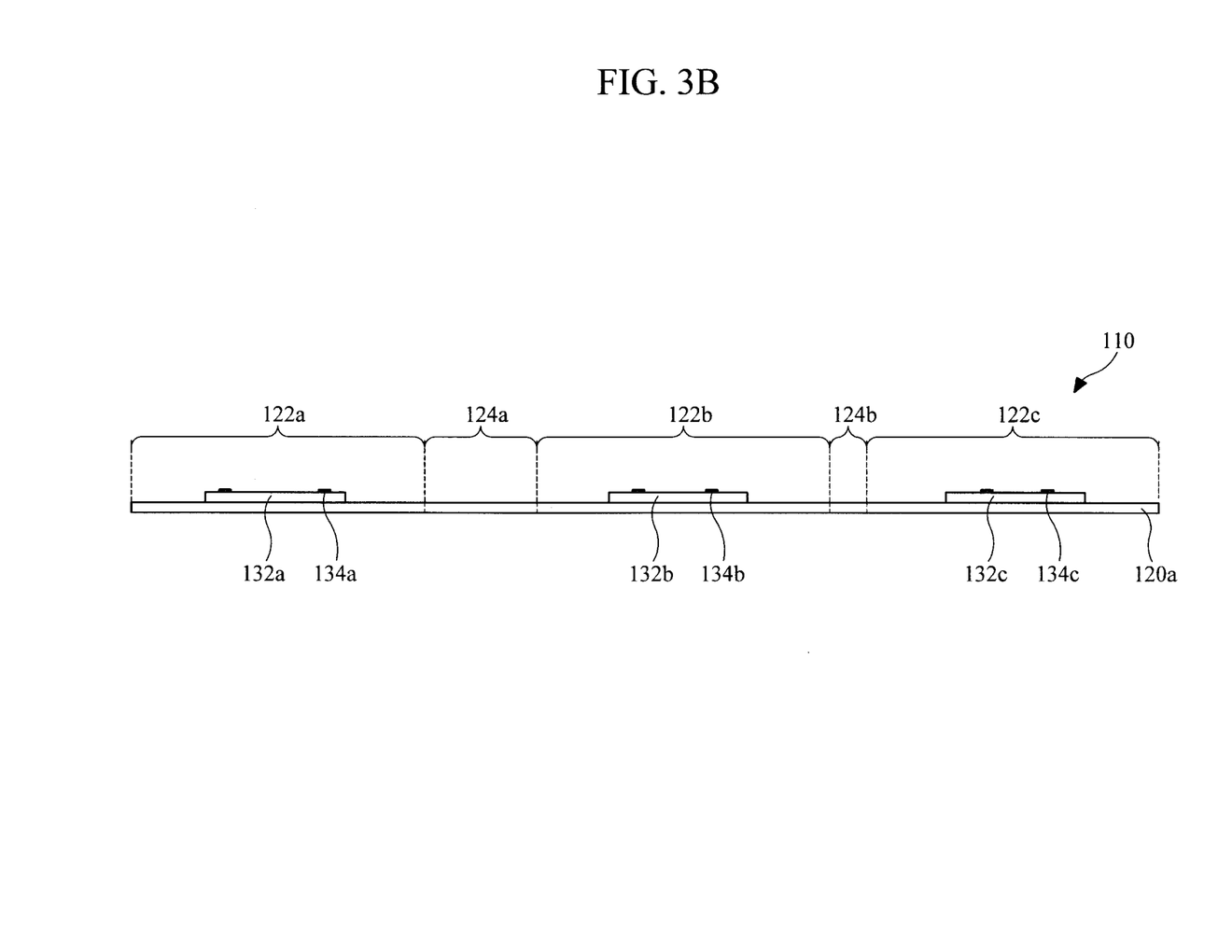

Referring to FIG. 3B, the first, second, and third active devices 132a, 132b, and 132c are mounted on the first flexible layer 120a, and more particularly, on the first, second, and third device packaging units 122a, 122b, and 122c, respectively. The active devices 132 may be attached onto the first flexible layer 120a using a predetermined bonding unit (not shown). The connection pads 134 may be formed on the active devices 132 such that they can face the wiring patterns 142 or the passive devices 146 later in subsequent processes. There is nearly no limit to the type of bonding unit used to attach the active devices 132 onto the first flexible layer 120a.

Figure 3C:
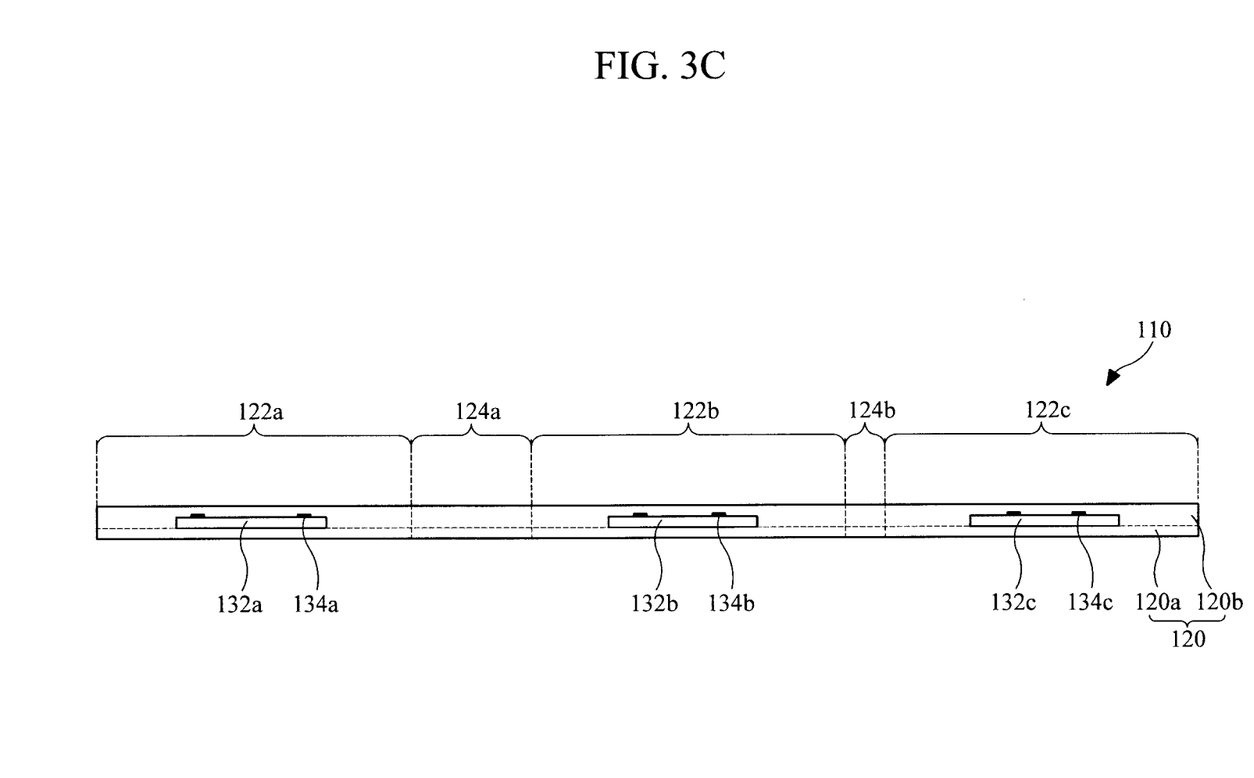

Referring to FIG. 3C, the second flexible layer 120b is formed on the first flexible layer 120a illustrated in FIG. 3B, i.e., the first flexible layer 120a on which the active devices 132 are attached. The second flexible layer 120b may be formed of the same material as that of the first flexible layer 120a. For example, the second flexible layer 120b, like the first flexible layer 120a, may be formed of a half-cured polymer. In this example, the first and second flexible layer 120a and 120b may be cured by being heated and then cooled. As a result, the first and second flexible layers 120a and 120b may be incorporated into a single flexible layer, thereby completing the formation of the flexible board or substrate 120.

Figure 3D:
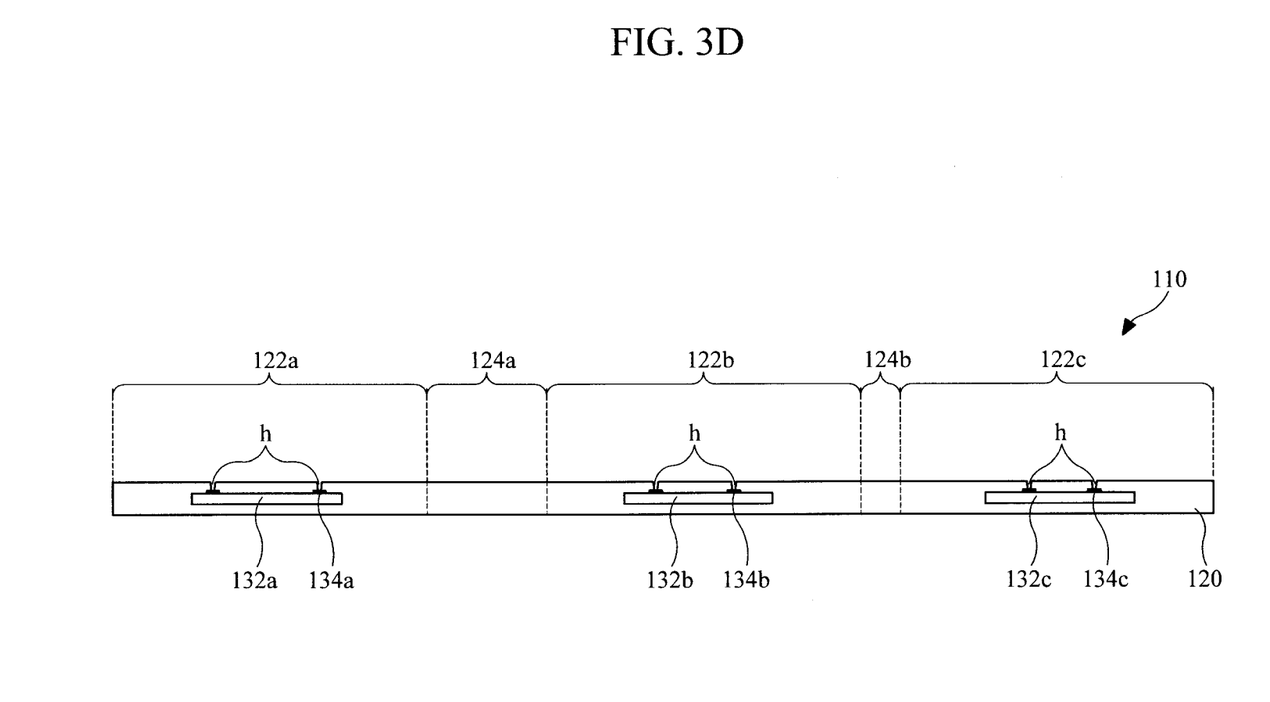

Referring to FIG. 3D, via holes h, which expose the connection pads 134 of the active devices 132, are formed in the flexible board or substrate 120. There are no restrictions on how to form the vial holes h. For example, the via holes h may be formed by partially etching the flexible board or substrate 120 using photolithography or by drilling holes into the flexible board or substrate 120 using plasma or laser.

Figure 3E:
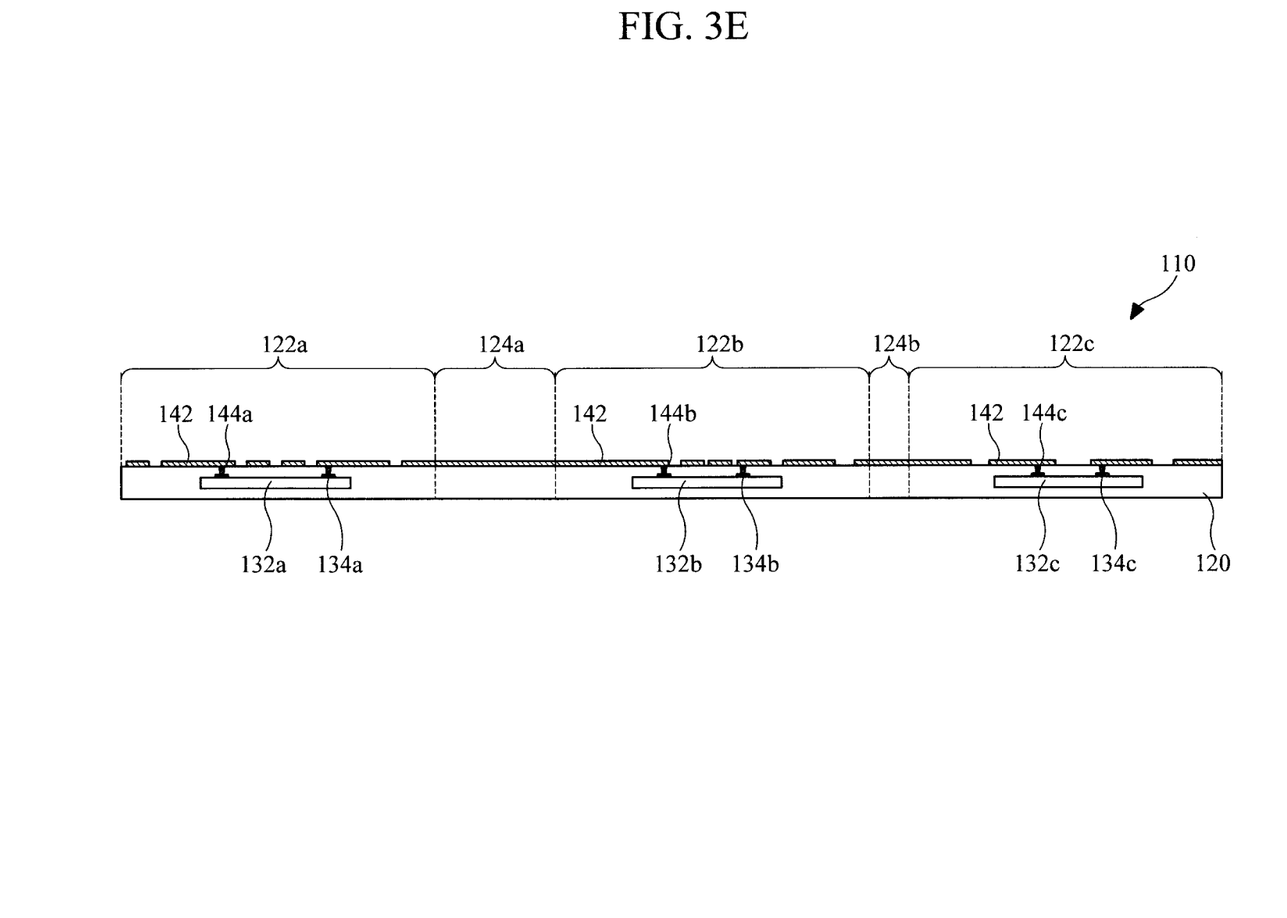

Referring to FIG. 3E, a conductive material may be formed in the flexible board or substrate 120 illustrated in FIG. 3D. For example, the vias 144, which fill the via holes h, may be formed by depositing a conductive material on the flexible board or substrate 120. The wiring patterns 142 may be formed by depositing a conductive material on the flexible board or substrate 120. Some of the wiring patterns 142 may be connected to the vias 144. There are no restrictions on how to form the vias 144 and the wiring patterns 142. For example, the vias 144 and the wiring patterns 142 may be formed by forming a seed layer through sputtering or electroless plating and continuously performing electrolytic plating on the seed layer.

The passive devices 146 may be mounted on the flexible board or substrate 120 illustrated in FIG. 3E, as illustrated in FIGS. 2A and 2B. As an example, the passive devices 146 may be mounted on the flexible board or substrate 120 such that they can be electrically connected to the wiring patterns 142. One or more passive devices 146 may be mounted on each of the first and second device packaging units 122a and 122b. The passive devices 146 may be mounted on the flexible board or substrate 120 in such a manner that the first passive devices 146a mounted on the first device packaging unit 122a and the second passive devices 146b mounted on the second device packaging unit 122b do not overlap each other when the flexible board or substrate 120 is folded.

In response to the passive devices 146 all being mounted on the flexible board or substrate 120, the first and second bonding units 152a and 152b may be disposed on the flexible board or substrate 120, and the flexible board or substrate 120 may be folded twice at the first and second folding units 124a and 124b, thereby completing the manufacture of the folded stacked package 110. Referring to FIG. 2B, the first bonding unit 152a may be placed in the space between the first and second device packaging units 122a and 122b, and the second bonding unit 152b may be placed in the space between the second and third device packaging units 122b and 122c.

As described above, since, in a folded stacked package, passive devices are directly disposed above wiring patterns formed at the time of embedding active devices, no PTHs are necessary for electrically connecting the passive devices and the active devices. Therefore, it is possible to improve the packaging density of a folded stacked package and prevent the electrical properties of a folded stacked package from deteriorating due to parasitic inductance or parasitic resistance. In addition, since the active devices are all embedded, it is possible to manufacture a thin folded stacked package.

The methods and/or operations described above may be recorded, stored, or fixed in one or more computer-readable storage media that includes program instructions to be implemented by a computer to cause a processor to execute or perform the program instructions. The media may also include, alone or in combination with the program instructions, data files, data structures, and the like. Examples of computer-readable storage media include magnetic media, such as hard disks, floppy disks, and magnetic tape; optical media such as CD ROM disks and DVDs; magneto-optical media, such as optical disks; and hardware devices that are specially configured to store and perform program instructions, such as read-only memory (ROM), random access memory (RAM), flash memory, and the like. Examples of program instructions include machine code, such as produced by a compiler, and files containing higher level code that may be executed by the computer using an interpreter. The described hardware devices may be configured to act as one or more software modules in order to perform the operations and methods described above, or vice versa. In addition, a computer-readable storage medium may be distributed among computer systems connected through a network and computer-readable codes or program instructions may be stored and executed in a decentralized manner.

A number of examples have been described above. Nevertheless, it should be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A folded stacked package comprising:
   a flexible board or substrate comprising a folding unit and first and second device packaging units connected by the folding unit and having wiring patterns formed thereon;
   one or more first devices embedded in the flexible board or substrate of the first and second device packaging units; and
   one or more second devices disposed on a surface of each of the first and second device packaging units,
   wherein the second devices disposed on the surface of the first device packaging unit and the second devices disposed on the surface of the second device packaging unit are configured not to overlap each other in response to the flexible board or substrate being folded at the folding unit so that the first and second packaging units face each other.

2. The folded stacked package of claim 1, wherein the first devices comprise active devices, and the second devices comprise one or more first passive devices mounted on the surface of the first device packaging unit and one or more second passive devices mounted on the surface of the second device packaging unit.

3. The folded stacked package of claim 2, wherein the first passive devices comprise a plurality of passive elements spaced apart from one another, and at least one of the second passive devices is disposed between a pair of adjacent first passive elements when the flexible board or substrate is folded at the folding unit.

4. The folded stacked package of claim 3, wherein a number of the second passive devices is less than a number of the first passive devices, and the second passive devices are spaced apart from one another and are disposed between the first passive devices when the flexible board or substrate is folded at the folding unit.

5. The folded stacked package of claim 1, further comprising one or more vias formed in the flexible board or substrate and electrically connecting the first devices and the wiring patterns.

6. The folded stacked package of claim 5, wherein the second devices are disposed directly above the vias in a case in which the flexible board or substrate is folded at the folding unit.

7. The folded stacked package of claim 1, wherein the first devices comprise a plurality of active devices and at least one active device is embedded in each of the first and second device packaging units.

8. The folded stacked package of claim 1, wherein the flexible board or substrate is formed of a half-cured polymer material.

9. The folded stacked package of claim 1, further comprising a bonding unit which bonds the first and second device packaging units when the flexible board or substrate is folded at the folding unit.

10. The folded stacked package of claim 1, wherein the first and second device packaging units correspond to parts of the flexible board or substrate on which the first and second devices are disposed.

11. The folded stacked package of claim 1, wherein the second devices comprise one or more first passive devices mounted on the surface of the first device packaging unit and one or more second passive devices mounted on the surface of the second device packaging unit, and wherein a number of the second passive devices is different from a number of the first passive devices.

12. A folded stacked package comprising:
a flexible board or substrate comprising a first device packaging unit, a first folding unit, a second device packaging unit, a second folding unit, and a third device packaging unit and having wiring patterns formed thereon;
one or more active devices embedded in the flexible board or substrate of the first, second, and third device packaging units; and
one or more passive devices disposed on a surface of each of the first and second device packaging units,
wherein the passive devices comprise one or more first passive devices disposed on the surface of the first device packaging unit and one or more second passive devices disposed on the surface of the second device packaging unit and the first passive devices and the second passive devices are configured not to overlap each other in response to the flexible board or substrate being folded at the folding unit so that the first and second packaging units face each other.

13. The folded stacked package of claim 12, wherein the first passive devices comprise a plurality of passive devices spaced apart from each other and at least one of the second passive devices is disposed between a pair of adjacent first passive devices when the flexible board or substrate is folded at the first folding unit.

14. The folded stacked package of claim 13, wherein a number of the second passive devices is less than a number of first passive devices, and the second passive devices are spaced apart from one another and are disposed between the first passive devices when the flexible board or substrate is folded at the first folding unit.

15. The folded stacked package of claim 12, further comprising one or more vias formed in the flexible board or substrate and electrically connecting the active devices and the wiring patterns.

16. The folded stacked package of claim 12, wherein the first or second passive devices are disposed directly above vias formed in the first and second device packaging units in a case in which the flexible board or substrate is folded at the first folding unit.

17. The folded stacked package of claim 12, wherein no passive device is mounted on the third device packaging unit.

18. The folded stacked package of claim 12, further comprising a first bonding unit which bonds the first and second device packaging units and a second bonding unit which bonds the second and third packaging units when the flexible board or substrate is respectively folded at the first and second folding units.

19. The folded stacked package of claim 12, wherein the first and second device packaging units correspond to parts of the flexible board or substrate on which the first and second devices are disposed.

20. The folded stacked package of claim 12, wherein the first passive devices comprise a plurality of passive devices spaced apart from each other and at least one of the second passive devices is disposed between a pair of adjacent first passive devices when the flexible board or substrate is folded at the first folding unit, and wherein a number of the second passive devices is different from a number of first passive devices.

* * * * *